US006239962B1

(12) United States Patent
Seymour et al.

(10) Patent No.: US 6,239,962 B1
(45) Date of Patent: May 29, 2001

(54) ARC FAULT CIRCUIT BREAKER

(75) Inventors: Raymond Kelsey Seymour; Murali Magham, both of Plainville; Fredic W. Glabau, Kensington; Kevin Jay Fuhr, Goshen; Michael Conrad Guerrette, Bristol, all of CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/246,322

(22) Filed: Feb. 9, 1999

(51) Int. Cl.[7] .............................. H01H 73/00; H05K 7/00
(52) U.S. Cl. ............................................ 361/115; 361/733
(58) Field of Search ................................ 361/42–50, 114, 361/115, 728, 729, 730, 733, 735, 743, 819; 355/202, 278

(56) References Cited

U.S. PATENT DOCUMENTS

| | | | |
|---|---|---|---|
| 3,401,363 | 9/1968 | Vyskocil et al. | 335/17 |
| 3,443,258 | 5/1969 | Dunham et al. | 337/79 |
| 3,596,218 | 7/1971 | Layton | 335/17 |
| 3,596,219 | 7/1971 | Erickson | 335/17 |
| 4,208,690 | 6/1980 | McGinnis et al. | 361/48 |
| 4,345,288 | 8/1982 | Kampf et al. | 361/31 |
| 4,466,071 | 8/1984 | Russell, Jr. | 364/492 |
| 4,513,268 | 4/1985 | Seymour et al. | 335/35 |
| 4,513,342 | 4/1985 | Rocha | 361/94 |
| 4,552,018 | 11/1985 | Legatti et al. | 73/431 |
| 4,573,259 | 3/1986 | Seymour et al. | 29/602 R |
| 4,589,052 | 5/1986 | Dougherty | 361/94 |
| 4,598,183 | 7/1986 | Gardner et al. | 200/50 A |
| 4,641,216 | 2/1987 | Morris et al. | 361/45 |
| 4,641,217 | 2/1987 | Morris et al. | 361/45 |
| 4,658,322 | 4/1987 | Rivera | 361/37 |
| 4,667,263 | 5/1987 | Morris et al. | 361/42 |
| 4,672,501 | 6/1987 | Bilac et al. | 361/96 |
| 4,686,600 | 8/1987 | Morris et al. | 361/42 |
| 4,688,134 | 8/1987 | Freeman et al. | 361/45 |
| 4,702,002 | 10/1987 | Morris et al. | 29/837 |
| 4,847,850 | 7/1989 | Kafka et al. | 372/71 |

(List continued on next page.)

FOREIGN PATENT DOCUMENTS

| | | | |
|---|---|---|---|
| 2036032 | 8/1991 | (CA) | H01H/71/24 |
| WO 91/13454 | 9/1991 | (WO) | H01H/75/00 |
| WO 95/20235 | 7/1995 | (WO) | H01H/71/52 |

*Primary Examiner*—Ronald W. Leja
(74) *Attorney, Agent, or Firm*—Cantor Colburn LLP; Carl B. Horton

(57) ABSTRACT

An arc fault circuit breaker assembled such that electrical interconnections, i.e., electrical connections between compartments, are made without disassembling any previously assembled compartment. The arc fault circuit breaker comprises housings having compartments within. Electrically connected components having interconnecting components, i.e., components which provide electrical interconnections between compartments, are disposed within the compartments. The housings are assembled together to enclose the compartments. Interconnecting components within an enclosed compartment extend through openings in the housings to provide electrical interconnections to the next compartment to be assembled. Therefore, no disassembly of the enclosed compartment is necessary to make the interconnections.

25 Claims, 6 Drawing Sheets

U.S. PATENT DOCUMENTS

| | | | |
|---|---|---|---|
| 4,878,143 | 10/1989 | Kalal et al. | 361/94 |
| 4,878,144 | 10/1989 | Nebon | 361/96 |
| 4,931,894 | 6/1990 | Legatti | 361/45 |
| 4,936,894 | 6/1990 | Larson et al. | 70/298 |
| 5,089,796 | 2/1992 | Glennon et al. | 335/172 |
| 5,121,282 | 6/1992 | White | 361/42 |
| 5,185,684 | 2/1993 | Beihoff et al. | 361/45 |
| 5,185,685 | 2/1993 | Tennies et al. | 361/45 |
| 5,185,686 | 2/1993 | Hansen et al. | 361/45 |
| 5,185,687 | 2/1993 | Beihoff et al. | 361/45 |
| 5,206,596 | 4/1993 | Beihoff et al. | 324/536 |
| 5,208,542 | 5/1993 | Tennies et al. | 324/544 |
| 5,223,682 | 6/1993 | Pham et al. | 200/148 R |
| 5,224,006 | 6/1993 | MacKenzie et al. | 361/45 |
| 5,229,730 | 7/1993 | Legatti et al. | 335/18 |
| 5,245,302 | 9/1993 | Brune et al. | 335/35 |
| 5,245,498 | 9/1993 | Uchida et al. | 361/47 |
| 5,250,918 | 10/1993 | Edds et al. | 335/35 |
| 5,299,730 | 4/1994 | Pasch et al. | 228/180.22 |
| 5,303,113 | 4/1994 | Goleman et al. | 361/93 |
| 5,307,230 | 4/1994 | MacKenzie | 361/96 |
| 5,359,293 | 10/1994 | Boksiner et al. | 324/544 |
| 5,418,463 | 5/1995 | Fleming et al. | 324/520 |
| 5,420,740 | 5/1995 | MacKenzie et al. | 361/45 |
| 5,432,455 | 7/1995 | Blades | 324/536 |
| 5,434,509 | 7/1995 | Blades | 324/536 |
| 5,452,223 | 9/1995 | Zuercher et al. | 364/483 |
| 5,453,723 | 9/1995 | Fello et al. | 335/18 |
| 5,459,630 | 10/1995 | MacKenzie et al. | 361/45 |
| 5,475,609 | 12/1995 | Apothaker | 364/492 |
| 5,483,211 * | 1/1996 | Carrodus et al. | 335/18 |
| 5,485,093 | 1/1996 | Russell et al. | 324/522 |
| 5,493,278 | 2/1996 | MacKenzie et al. | 340/638 |
| 5,506,789 | 4/1996 | Russell et al. | 364/492 |
| 5,510,946 | 4/1996 | Franklin | 361/56 |
| 5,510,949 | 4/1996 | Innes | 361/93 |
| 5,512,832 | 4/1996 | Russell et al. | 324/522 |
| 5,519,561 | 5/1996 | Mrenna et al. | 361/105 |
| 5,546,266 | 8/1996 | MacKenzie et al. | 361/93 |
| 5,550,751 | 8/1996 | Russell | 364/492 |
| 5,561,605 | 10/1996 | Zuecher et al. | 364/483 |
| 5,578,931 | 11/1996 | Russell et al. | 324/536 |
| 5,583,732 | 12/1996 | Seymour et al. | 361/93 |
| 5,590,012 | 12/1996 | Dollar, II | 361/113 |
| 5,600,526 | 2/1997 | Russell et al. | 361/65 |
| 5,614,878 | 3/1997 | Patrick et al. | 335/14 |
| 5,615,075 | 3/1997 | Kim | 361/87 |
| 5,629,824 | 5/1997 | Rankin et al. | 361/57 |
| 5,659,453 | 8/1997 | Russell et al. | 361/93 |
| 5,694,101 | 12/1997 | Lavelle et al. | 335/172 |
| 5,706,154 | 1/1998 | Seymour | 361/42 |
| 5,818,671 | 10/1998 | Seymour et al. | 361/42 |
| 5,831,500 | 11/1998 | Turner et al. | 335/17 |

* cited by examiner

ARC FAULT CIRCUIT BREAKER

BACKGROUND OF THE INVENTION

The present invention relates generally to a circuit breaker. More specifically the present invention relates to an arc fault circuit breaker.

Arc fault circuit breakers are well known. These breakers comprise contacts that open upon sensing arcing from line to ground, and/or from line to neutral. Arc fault circuit breakers typically use a differential transformer to measure arcing from line to ground. Detecting arcing from line to neutral is accomplished by detecting rapid changes in load current by measuring voltage drop across a relatively constant resistance, usually a bi-metal resistor.

Components of arc fault circuit breakers are generally assembled into separate compartments as defined by their function. More specifically, mechanical components, e.g., load current carrying and switching components, of each pole are assembled into mechanical compartments, while the current sensing components are assembled into an electronics compartment. In order to connect the compartments, the load current of each pole must be routed from the mechanical compartments into the electronics compartment, through appropriate current sensing devices, and back into the mechanical compartments. Additionally sensing lines, e.g., from the bi-metal resistors, must also be routed from the mechanical compartments into the electronics compartment.

Because these circuit breakers sense arc faults, which are essentially short circuits, the connections of the load current carrying components throughout the circuit breaker must be capable of withstanding enormously high surge currents, sometimes in excess of 10,000 amps. The stresses caused by these extremely large surge currents can blow a connection apart that is not manufactured to proper quality standards. This means that during the assembly process, high quality connections, e.g., welds, bolts, or crimps, must be carefully made and inspected in order to survive the extremely high surge currents, and must be completed at a rate that meets the production schedule.

However, in prior art circuit breakers, interconnecting between the various mechanical and electronics compartments, i.e., interconnections, requires partial disassembly of the compartments in order for the production tooling to reach them. This procedure provides very little work space, making it difficult, costly and time-consuming to make the high quality interconnections required.

BRIEF SUMMARY OF THE INVENTION

In an exemplary embodiment of the invention, an arc fault circuit breaker comprises a plurality of housings having compartments therein. Electrically connected components having interconnecting components, i.e., components which provide electrical interconnections between compartments, are disposed within the compartments. The housings are assembled together to enclose the compartments. Interconnecting components within an enclosed compartment extend through openings in the housings to provide electrical interconnections to the next compartment to be assembled. Therefore, no disassembly of the enclosed compartment is necessary to make the interconnections.

BRIEF DESCRIPTION OF THE DRAWINGS

Referring now to the drawings wherein like elements are numbered alike in the several Figures.

DETAILED DESCRIPTION OF THE INVENTION

Figure 1:
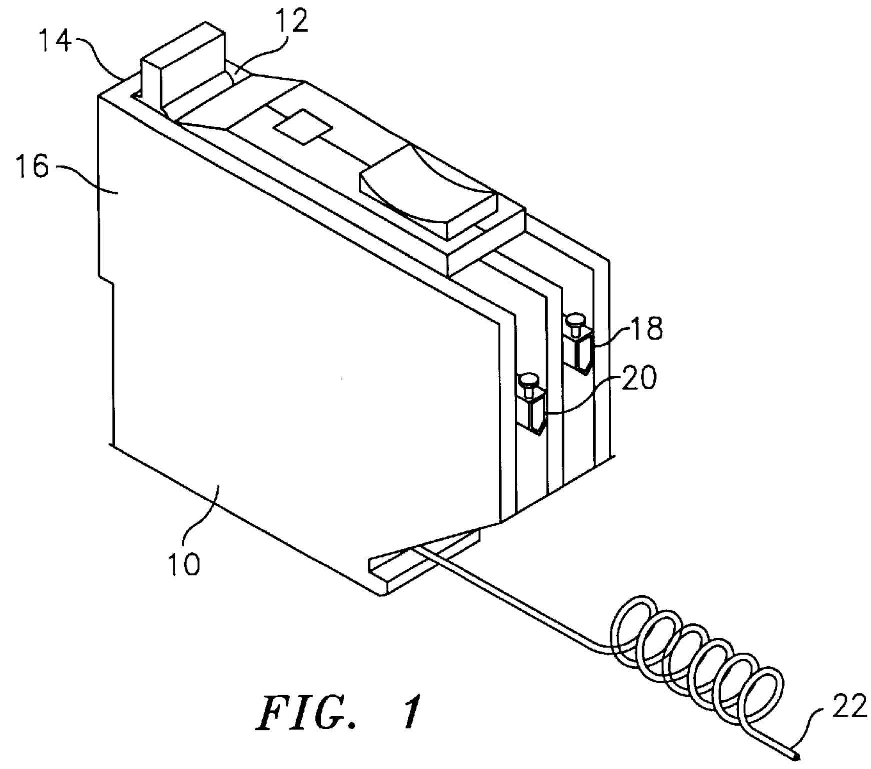
FIG. 1 is perspective view of a single pole circuit breaker in accordance with present invention.

Referring to FIG. 1, an exemplary embodiment of a fully assembled single pole arc fault circuit breaker is shown generally at 10. Circuit breaker 10 comprises a first housing 12, a second housing 14, and a cover 16 that are assembled securely together with a plurality of bolts (not shown). First housing 12 defines a mechanical compartment 24, having load current carrying and switching components 25 disposed therein (see FIG. 2). Second housing 14 defines an electronics compartment 58, having current sensing components 57 and neutral current carrying components 59 disposed therein (see FIG. 3). A load current from a source (not shown) connects to line connection 36 (see FIG. 2), and conducts along the current carrying and switching components 25 to load lug 18 for customer connection to a load (not shown). A neutral current from the load connects to neutral lug 20 (see FIG. 3), and conducts along the heutral current carrying components 59 to neutral return wire 22 for customer connection to the source. Arc faults are sensed and processed by sensing components 57. As more particularly described hereinafter, the arc fault circuit breaker 10 is assembled such that electrical interconnections, i.e., electrical connections between the mechanical and electronics compartments 24 and 58, are made without disassembling any previously assembled compartment.

Figure 2:
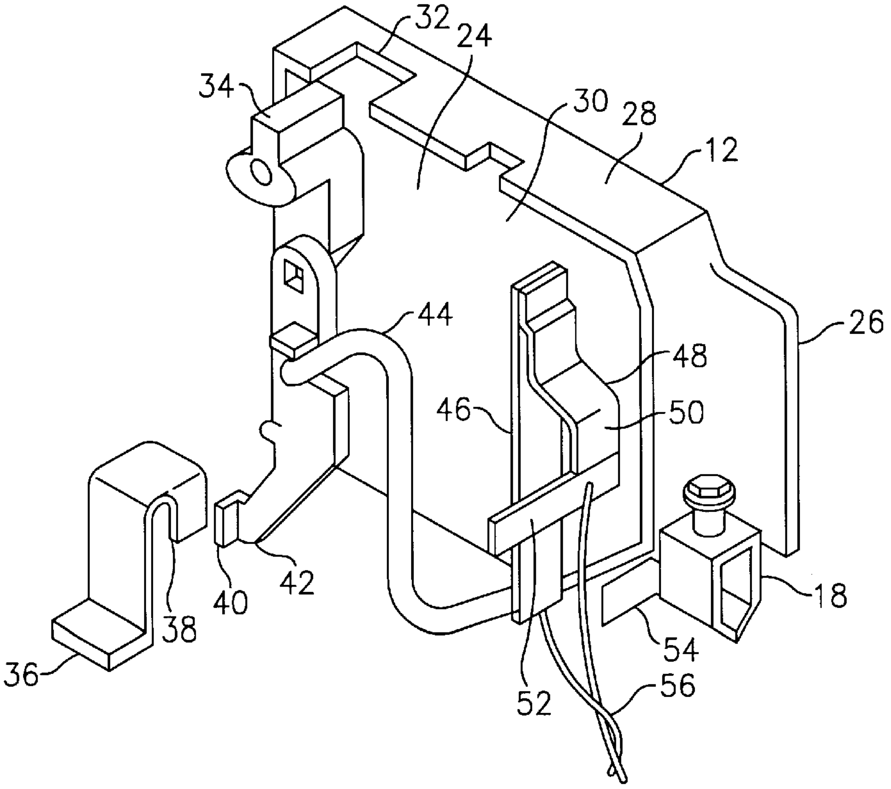
FIG. 2 is an exploded view of the mechanical compartment of the single pole circuit breaker of FIG. 1.

Referring to FIG. 2, the mechanical compartment 24 is shown in detail. First housing 12 is generally rectangular in shape, and formed of electrical insulative material, i.e., plastic. First housing 12 comprises first insulative tab 26, first rim 28, and first side wall 30. First tab 26 protrudes forwardly from the front of first housing 12 adjacent load lug 18 to provide an insulative barrier. First rim 28 extends around the periphery of first side wall 30. A first rectangular slot 32 is located in rim 28 at the top and back of first housing 12 and sized to receive pole handle 34. First side wall 30 and first rim 28 define the mechanical compartment 24 which includes the load current carrying and switching components 25. The load current carrying and switching components 25 within the mechanical compartment 24 are electrically connected, e.g., welded, bolted, or crimped, to form a load current path. The load current path begins at line connection 36 where the load current enters the mechanical compartment 24. Line connection 36 includes a lower tab 37 to connect to a source line (not shown), and a fixed contact 38 which extends downwardly from the upper end of line connection 36. Blade 42 is pivotally engaged to the first housing 12 and pivotally attached to insulated pole handle 34. A lower end of blade 42 includes a flat contact 40 which is forcibly biased against contact 38 to provide electrical continuity for the load current. Pole handle 34 is pivotally attached to first housing 12 and extends outwardly from mechanical compartment 24 into the electronics compartment 58.

Blade 42 is electrically connected to a bottom distal end of bimetal resistor 46 via braid 44. A top distal end of bimetal resistor 46 is in turn electrically connected to L-shaped strap 48. L-shaped strap 48 comprises a vertical strap body 50 and a horizontal strap extension 52. Horizontal strap extension 52 forms a substantially right angle with vertical strap body 50, and extends outwardly from mechanical compartment 24 into electronics compartment 58. Load terminal 54 also extends outwardly from the mechanical compartment 24 into electronics compartment 58. Load terminal 54 is in turn electrically connected to the load lug 18. The load current path conducts the load current from the line connection 36, through contacts 38 and 40, through blade 42, braid 44, bimetal resistor 46, and L-shaped strap 48. At this point, the load current path passes out of the mechanical compartment 24 through horizontal strap extension 52. The load current path returns to the mechanical compartment 24 through load terminal 54 and out through the load lug 18 to the load. When an arc fault is detected the pole handle 34 pivots clockwise, which in turn pivots blade 42 to separate contacts 38 and 40 and thereby open the load current path.

Twisted pair conductor 56 is electrically connected to the bottom distal end of bimetal resistor 46 and horizontal strap extension 52 of the L-shaped strap 48 to sense arcing from the line to neutral as is well known. This is accomplished by measuring the voltage drop across the bimetal resistor 48 that results from rapid changes in load current caused by arcing from line to neutral.

Figure 3:
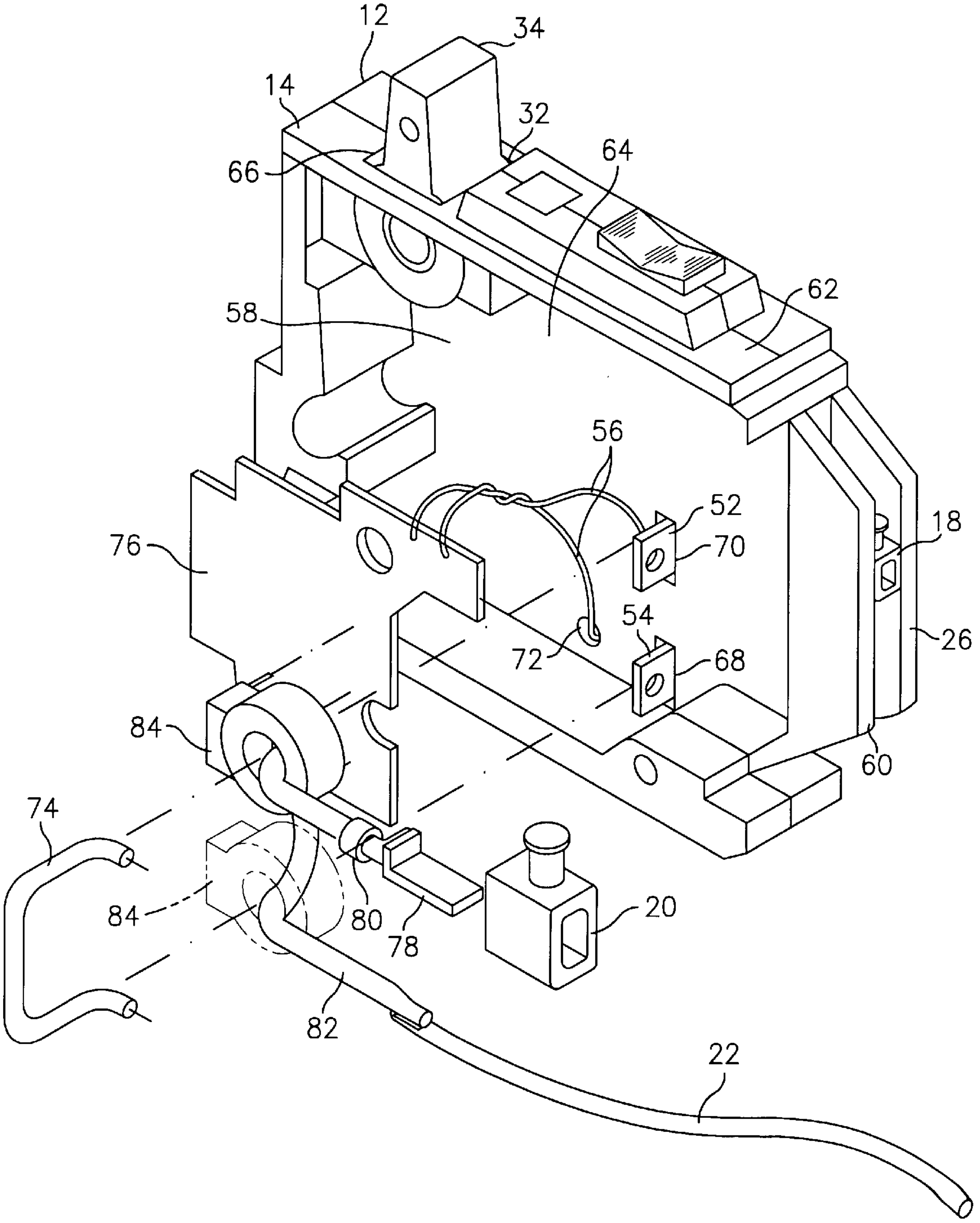
FIG. 3 is an exploded view of the electronics compartment of the single pole circuit breaker of FIG. 1.

Referring to FIG. 3, the electronics compartment 58 is shown in detail. Second housing 14 is generally rectangular in shape and formed of electrical insulative material, i.e., plastic. Second housing 14 comprises second insulative tab 60, second rim 62, and second side wall 64. Second tab 60 protrudes forwardly from the front of second housing 14 adjacent neutral lug 20 to provide an insulative barrier. Second rim 62 extends around the periphery of second side wall 64. A second rectangular slot 66 is located in rim 62 and cooperates with slot 32 to receive and secure pole handle 34 when housings 12 and 14 are assembled together. Second side wall 64 and second rim 62 define the electronics compartment 58 which includes the current sensing components 57 and the neutral current carrying components 59. The second housing 14 is assembled securely against first housing 12 with a plurality of bolts (not shown) to enclose mechanical compartment 24 and to capture the components within, as well as to insulate and secure load lug 18 between tabs 26 and 60.

Second side wall 64 of second housing 14 includes rectangular through holes 68 and 70 and circular through hole 72 to provide openings in the second housing 14 to permit the load terminal 54, horizontal strap extension 52 and twisted pair conductor 56 to extend through to the electronics compartment 58. This enables all electrical interconnections between compartments 24 and 58 to be completed in electronics compartment 58. During production, this allows compartments 24 and 58 to be assembled sequentially without the need to disassemble mechanical compartment 24. That is, mechanical compartment 24 is assembled first with the interconnecting components 54, 52 and 56 extending outwardly from the compartment 24. Second housing 14 is then assembled to first housing 12 enclosing the mechanical compartment 24, but allowing the interconnecting components 54,52, and 56 to extend therethrough. The electronics compartment 58 may then be assembled and the associated components be interconnected to the components of the mechanical compartment 24 without any disassembly of mechanical compartment 24. This provides for a large work space for tooling and assembly when interconnecting the components of the compartments 24 and 58. Therefore, high quality interconnections are more consistently, and cost effectively made then in prior art circuit breakers.

Current sensing components 57 comprise circuit board 76 which is electrically connected to solenoid 77, current sensing transformer 84, and optional current sensing transformer 84'. Upon receiving signals indicative of an arc fault, circuit board 76 provides a trip signal to trip the arc fault circuit breaker 10.

Solenoid 77 comprises trip rod 75 for engaging or pivoting the pole handle in response to the trip signal, and provides the means to trip the circuit breaker 10 under arc fault conditions. That is when an arc fault is sensed, circuit board 76 generates a trip signal to actuate solenoid 77, which extends the trip rod 75 to engage pole handle 34. The pole handle 34 pivots, which in turn pivots blade 42 to operate contacts 38 and 40 and thereby open the load current path.

Twisted pair conductor 56 is electrically interconnected to circuit board 76. The circuit board senses the voltage across the bi-metal resistor 46 and generates a trip signal to actuate the solenoid in response to a rapid voltage drop indicative of arcing across the line and neutral leads.

The load current path is completed by electrically interconnecting strap extension 52 and load terminal 54 to the respective distal ends of wire connector 74. Wire connector 74 can be formed from various suitable conductive materials, e.g., insulated wire, rectangular formed magnetic wire, square formed magnetic wire, or insulated sleeve covered braided copper. Wire connector 74 is routed through a center of a sensing transformer 84 such that the flow of the load current through the center of transformer 84 is in a known direction.

The neutral current carrying components 59 within the electronics compartment 58 are electrically connected, e.g., welded, bolted, or crimped, to form a neutral current path for the neutral current. The neutral current path begins at neutral lug 20 where the neutral current enters the electronics compartment 58. Neutral lug 20 secures the neutral lead connected to the load against neutral terminal 78 to provide electrical continuity thereto. Neutral terminal 78 is electrically connected to neutral return wire 22 via copper braid 82. Insulated sleeve 80 surrounds a portion of copper braid 82 and provides electrical insulation between copper braid 82 and a circuit board 76. Copper braid 82 is routed through the center of sensing transformer 84 such that the flow of the neutral current through the center of transformer 84 is in the opposite direction of the flow of the load current through lead 74.

Both the copper braid 82 of the neutral current path, and wire connector 74 of the load current path are routed through the current sensing transformer 84 to sense arcing from line to ground as is well known. This is accomplished by routing the flow of the neutral current through the sensing transformer 84 in the opposite direction to the flow of the load current. The total current flow through sensing transformer 84 thus cancels unless an external ground fault current is caused by arcing from line to ground. The resulting differential signal, sensed by sensing transformer 84, is indicative of the ground fault current and is processed by circuit board 76.

Optional current sensing transformer 84' is used for ground fault applications where a separate sensor is needed to detect improper wiring by the customer, e.g., the neutral current path is wired backwards. That is, the copper braid 82 of the neutral current path is routed through the optional current sensing transformer 84'. The resulting signal, sensed by optional current sensing transformer 84', is indicative of the neutral current direction and magnitude, and is processed by circuit board 76.

Figure 4:
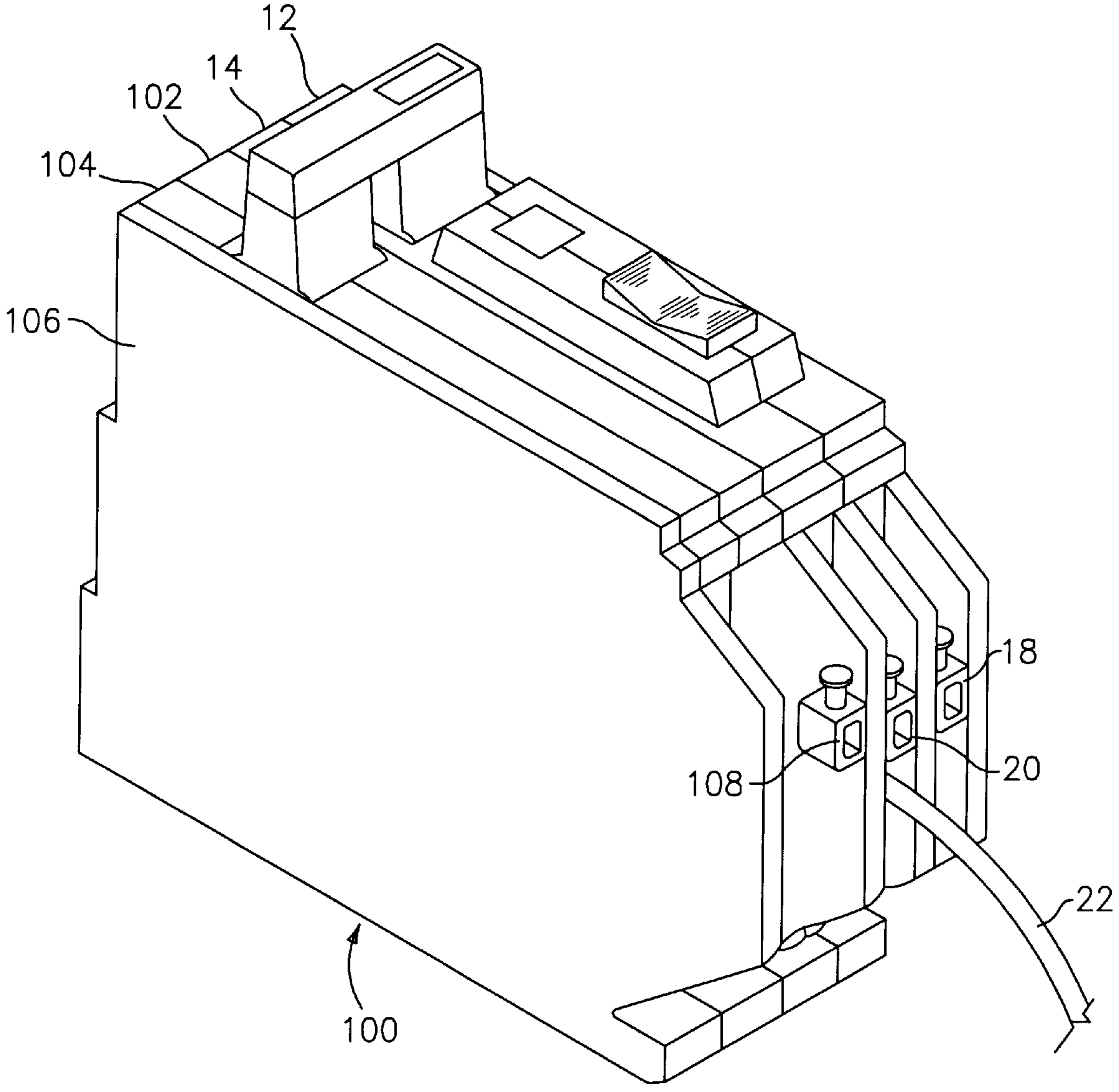
FIG. 4 is a perspective view of a two pole circuit breaker in accordance with the present invention.

Referring to FIG. 4, an exemplary embodiment of a fully assembled two pole arc fault circuit breaker is generally shown at 100. Circuit breaker 100 comprises the first housing 12, the second housing 14, a third housing 102, a fourth housing 104, and a cover 106 that are assembled securely together with a plurality of bolts (not shown). The first housing 12 defines the mechanical compartment 24 having the load current carrying and switching components 25 disposed therein (see FIG. 2). The second housing 14 and third housing 102 define an electronics compartment 110 having first and second pole current sensing components 109 and neutral current carrying components 111 disposed therein (see FIGS. 5 and 6). Fourth housing 104 defines a second pole mechanical compartment 134 having second load current carrying and switching components 135 disposed therein (see FIG. 7). A first and second load currents from a source (not shown) connects to line connections 36 and 148 respectively (see FIGS. 2 and 7), and conducts along load current carrying and switching components 25 and 135 to load lugs 18 and 108 for customer connection to a first and second loads (not shown). A neutral current, common to both first and second loads, connects to neutral lug 20, and conducts along the neutral current carrying components 59 to neutral return wire 22 for customer connection to the source. Arc faults are sensed and processed by first and second pole current sensing components 109. As more particularly described hereinafter, the arc fault circuit breaker 100 is assembled such that electrical interconnections, i.e., electrical connections between mechanical compartments 24 and 134 and electronics compartment 58, are made without disassembling any previously assembled compartment.

Referring to FIG. 2, in this embodiment, housing 12 and the mechanical compartment 24 are common to both circuit breakers 10 and 100. Therefore the disclosure pertaining to housing 12 and compartment 24 in the single pole embodiment 10 also applies to the two pole embodiment 100.

Figure 5:
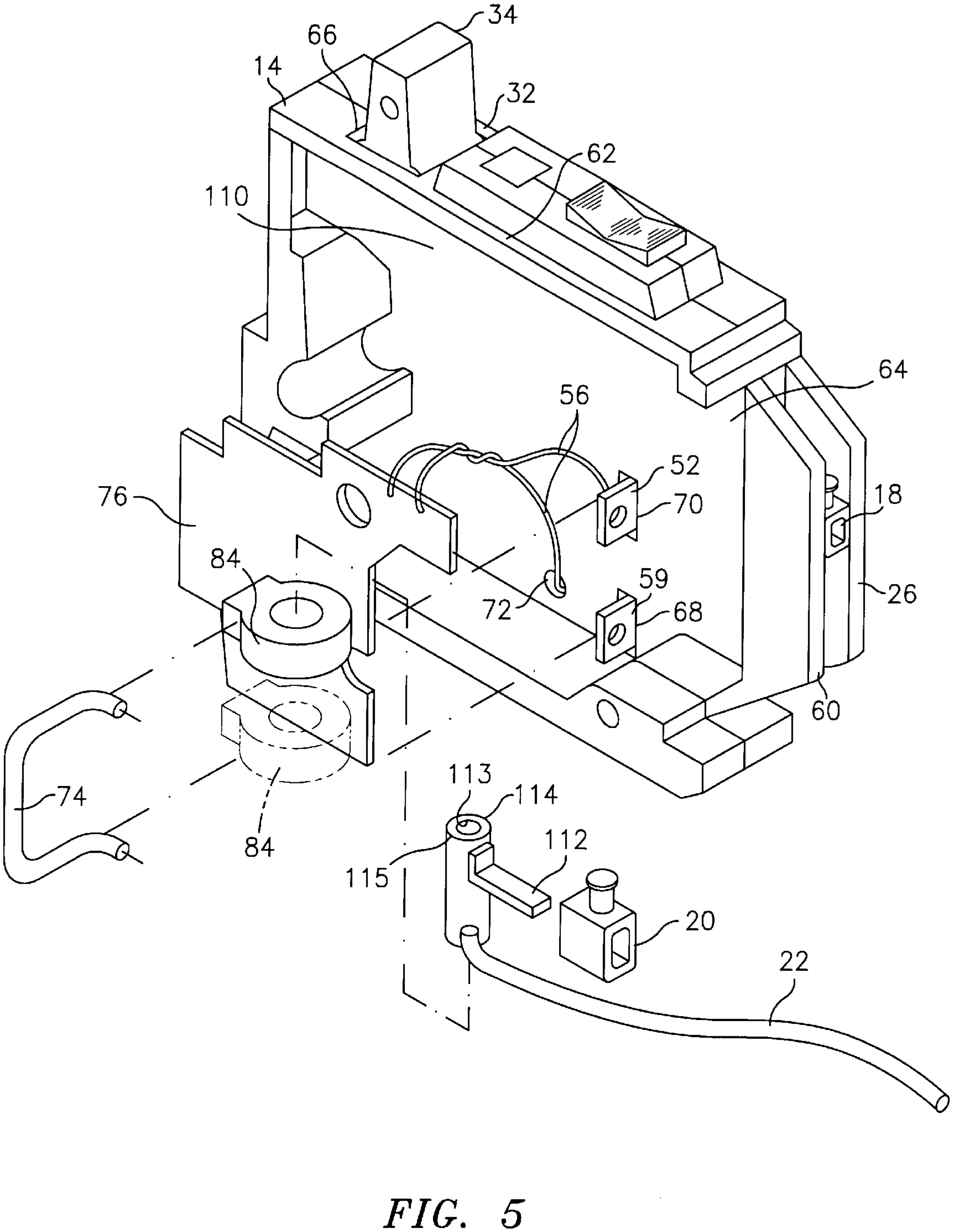
FIG. 5 is an exploded view of the electronics compartment of the two pole circuit breaker of FIG. 4.
Figure 6:
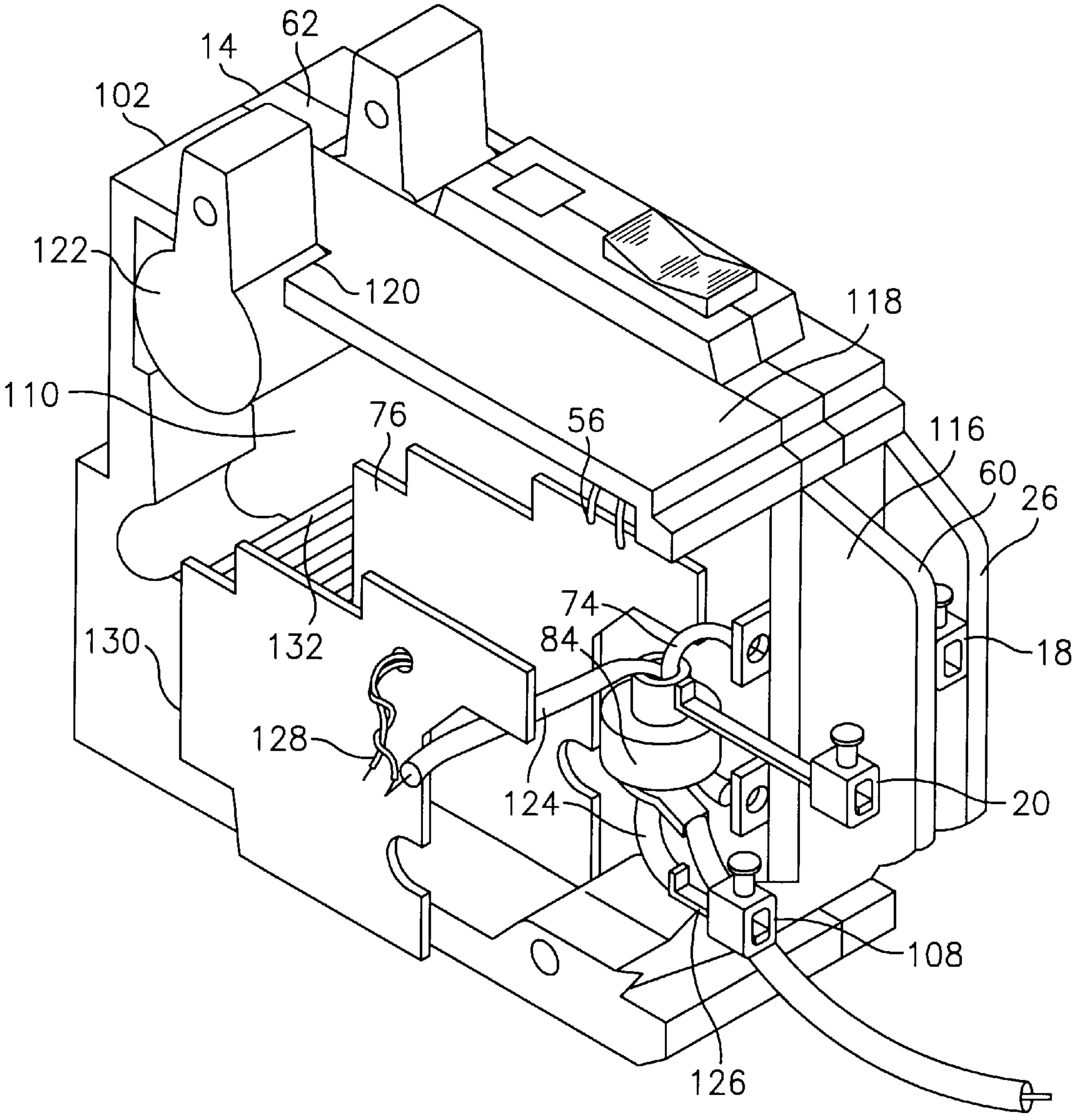
FIG. 6 is an exploded view of the electronics compartment of the two pole circuit breaker of FIG. 4.

Referring to FIGS. 5 and 6, electronics compartment 110 is shown in detail. In this embodiment, housing 14 is common to both single pole 10 and two pole 100 circuit breakers. Additionally, all electrical interconnections between the mechanical compartment 24 and the electronics compartments 58 and 110, of circuit breakers 10 and 100 respectively, are identical. Therefore the disclosure pertaining to housing 14 and the interconnections in the mechanical compartment 24 of the single pole embodiment 10 also apply to the two pole embodiment 100.

Third housing 102 is generally rectangular in shape and formed of electrical insulative material, i.e., plastic. Third housing 102 comprises third insulative tab 116, and third rim 118. Third insulative tab 116 protrudes forwardly from the front of third housing 102 adjacent second load lug 108 to provide an insulative barrier. Third rim 118 extends around a border of third housing 102. A third rectangular slot 120 is located in rim 118 at the top and back of third housing 102 and is sized to receive second pole handle 122. Third rim 118 of third housing 102 assembles securely against second rim 62 of second housing 14 extending electronics compartment 110 outwardly to accommodate the first and second pole current sensing components 109. Third rim 118, second rim 62, and second side wall 64 define the electronics compartment 110.

First and second pole current sensing components 109 comprise circuit board 76 and second circuit board 130, which are electrically connected by means of a flexible connector 132 used to link signals for processing. Additionally, circuit board 76 is electrically connected to solenoid 77, current sensing transformer 84 and optional current sensing transformer 84'. Upon receiving signals indicative of an arc fault, circuit board 76 provides a trip signal to trip the arc fault circuit breaker 100.

Solenoid 77 comprises trip rod 75 and provides the means to trip the circuit breaker 100 under arc fault conditions as will be discussed hereinafter.

The twisted pair conductor 56 is electrically interconnected to the circuit board 76 as previously discussed in the single pole circuit breaker 10 embodiment. A twisted pair conductor 128 is electrically connected to the second printer circuit board 130. The circuit board senses the voltage across the bi-metal resistor 158 (see FIG. 7) and generates a trip signal to actuate the solenoid in response to a rapid voltage drop indicative of arcing across the line and neutral leads.

The neutral current carrying components 111 within the electronics compartment 110 are electrically connected to form a neutral current path for the neutral current. The neutral current path begins at neutral lug 20 where the neutral current enters the electronics compartment 110. Neutral lug 20 secures the neutral leads connecting to the first and second loads against neutral terminal 112 to provide electrical continuity thereto. Neutral terminal 112 and neutral return wire 22 are electrically connected to a top and bottom distal end respectively, of copper tube sleeve 114. Copper tube sleeve 114 is cylindrical in shape and further comprises an inside diameter 113 and an outside diameter 115. Inside diameter 113 is sized to receive both wire connector 74 and second wire connector 124 as will be discussed hereinafter. Outside diameter 115 is sized to fit through the center of current sensing transformer 84. Optionally the copper tube sleeve 114 could be made of braided conductor wire. This also routes the flow of the neutral current through the center of current sensing transformer 84 in a known direction.

The first load current path (see FIGS. 5 & 6), extending from the mechanical compartment 24, is completed by electrically interconnecting strap extension 52 and load terminal 54 to the respective distal ends of wire connector 74 as discussed previously. Wire connector 74 is routed through the inside diameter 113 of copper tube sleeve 114 such that the flow of the first load current through the center of transformer 84 is in a direction opposite to the flow of the neutral current through copper tube sleeve 114.

A second load current path for the second load current is partially formed by electrically connecting a second wire connector 124 to a second load terminal 126, which is in turn connected to the second load lug 108. Second wire connector 124 is also routed through the inside diameter 113 of copper tube sleeve 114 such that the flow of the second load current through the center of transformer 84 is in a direction opposite to the flow of the neutral current through copper tube sleeve 114. In this exemplary embodiment of the invention, the second load lug 108 is located in the electronics compartment 110 as will be discussed hereinafter.

First wire connector 74 of the first load current path and second wire connector 124 of the second load current path are routed through the inside diameter 113 of copper tube sleeve 114 of the neutral current path. Copper tube sleeve 114 is in turn routed through the center of current sensing transformer 84 to sense arcing from line to ground as is well known. This is accomplished by routing the flow of the neutral current through the sensing transformer 84 in the opposite direction to the flow of the combined first load and second load currents. The total current flow through sensing transformer 84 thus cancels unless an external ground fault current is caused by arcing from line to ground. The resulting differential signal, sensed by sensing transformer 84, is indicative of the ground fault current and is processed by circuit board 76.

Optional current sensing transformer 84' is used for ground fault applications where a separate sensor is needed to detect improper wiring by the customer, e.g., the neutral current path is wired backwards, as previously discussed in the single pole circuit breaker 10 embodiment.

Figure 7:
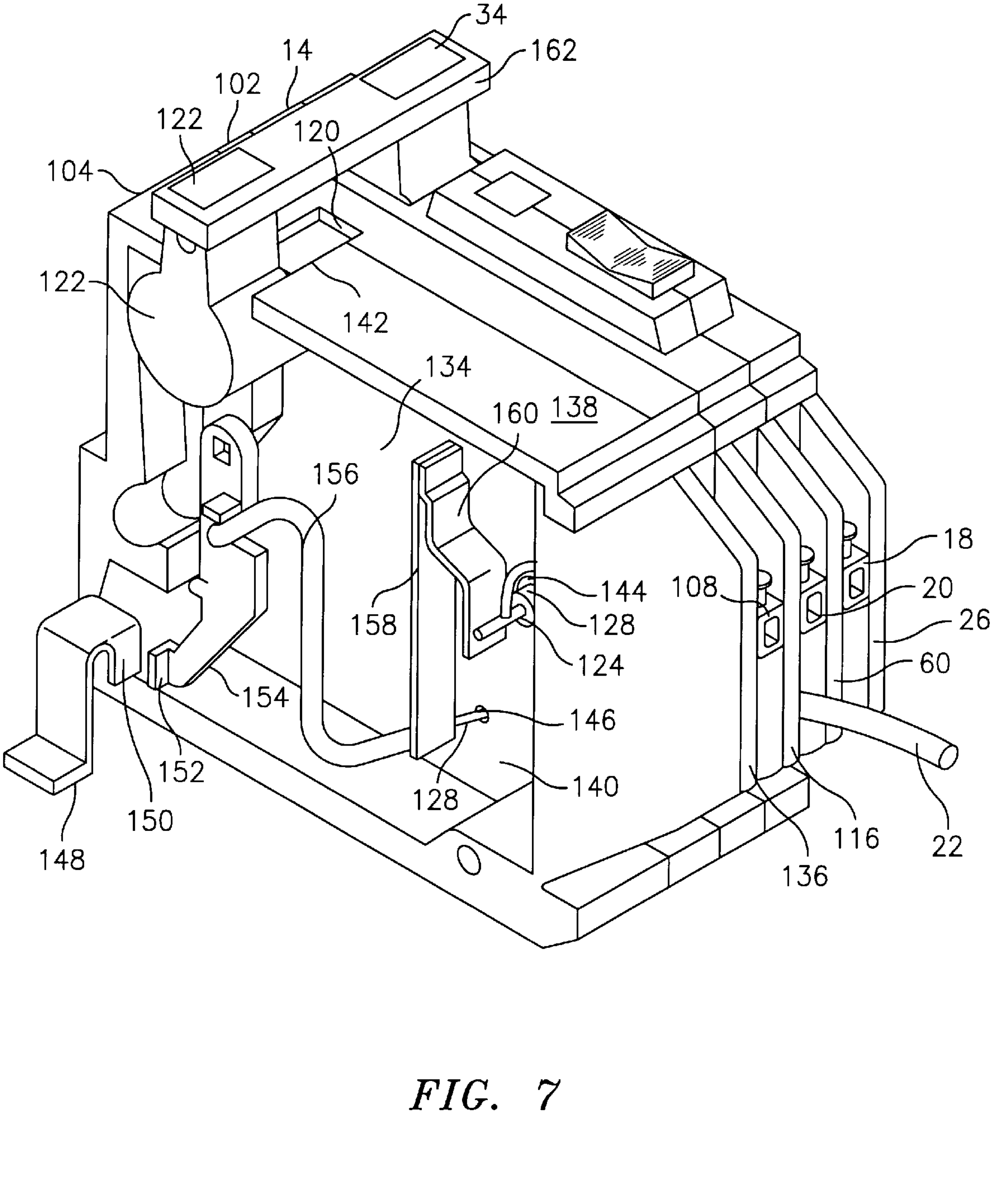
FIG. 7 is an exploded view of the mechanical compartment of the two pole circuit breaker of FIG. 4.

Referring to FIG. 7, the second pole mechanical compartment 134 is shown in detail. Fourth housing 104 is generally rectangular in shape and formed of electrical insulative material, i.e., plastic. Fourth housing 104 comprises fourth insulative tab 136, fourth rim 138, and fourth side wall 140. Fourth tab 136 protrudes forwardly from the front of fourth housing 104 adjacent load lug 108 to provide an insulative barrier. Fourth rim 138 extends around the periphery of fourth side wall 140. A fourth rectangular slot 142 is located in rim 138 and cooperates with slot 120 to receive and secure second pole handle 122 when housings 104 and 102 are assembled together. Fourth side wall 140 fourth rim 138 define the second mechanical compartment 134 which includes the second load current carrying and switching components 135. The fourth housing 104 is assembled securely against third housing 102 with a plurality of bolts (not shown) to enclose electronics compartment 110 and to capture the components within electronics compartment 110, as well as to insulate and secure second load lug 108 between tabs 136 and 116.

Fourth side wall 140 includes circular through holes 144 and 146 to provide openings in the fourth housing 104 to permit the second wire connector 124 and second twisted pair conductor 128, to extend through to the mechanical compartment 134. This enables all electrical interconnections between compartments 110 and 134 to be connected in mechanical compartment 134. During production, this allows compartments 110 and 134 to be assembled sequentially without the need to disassemble electronics compartment 110. This provides for a larger work space for tooling, e.g., welding equipment, then prior art circuit breakers when interconnecting the components of the compartments 110 and 134. Therefore, higher quality interconnections are more consistently, and cost effectively made.

The second load current carrying and switching components 135 within the second mechanical compartment 134 are electrically connected to form a second load current path. The second load current path begins at line connection 148 where the second load current enters the second mechanical compartment 134. Line connection 148 includes a second lower tab 149 to connect to a source line (not shown), and a fixed contact 150 which extends downwardly from the upper end of line connection 148. Blade 154 is pivotally engaged to the fourth housing 104 and pivotally attached to insulated second pole handle 122. A lower end of blade 154 includes a flat contact 152 which is forcibly biased against contact 150 to provide electrical continuity for the second load current. Second pole handle 122 is pivotally attached to fourth housing 104 and extends from mechanical compartment 134 into the electronics compartment 110. A handle tie 162 connects the two individual pole handles 122 and 34 together.

Blade 154 is electrically connected to a bottom distal end of bimetal resistor 158 via braid 156. A top distal end of bimetal resistor 158 is in turn electrically connected to second strap 160. Second strap 160 is electrically interconnected to wire connector 124. The second load current path conducts the second load current from the line connection 148 through contacts 150 and 152, through blade 154, braid 156, bimetal resistor 158, strap 160, and wire connector 124. At this point, the second load current path passes out of the second mechanical compartment 134 through wire connector 124 which is routed into the electronics compartment 110 through circular through hole 144. The second load current path then conducts the second load current through second wire connector 124, second load terminal 126, and out through the second load lug 108 to the load. When an arc fault is detected the pole handle 122 pivots clockwise, which in turn pivots blade 154 to separate contacts 150 and 152 and thereby open the second load current path.

In this exemplary embodiment, because the second load lug 108 is located in the electronics compartment 110 rather than mechanical compartment 134, the only load current carrying interconnection within the second mechanical compartment 134 is between the second strap 160 and the second wire connector 124. Additionally, more room is provided in the second mechanical compartment 134 for the tooling required to weld strap 160 and wire connector 124 together. Therefore, the assembly process is simplified.

Twisted pair conductor 128 is electrically interconnected to the bottom distal end of bimetal resistor 158 and second strap 160 to sense arcing from line to neutral as is well known. This is accomplished by measuring the voltage drop across the bimetal resistor 158 that results from rapid changes in load current caused by arcing from line to neutral. The twisted pair conductor 128 is electrically connected to second circuit board 130 for signal processing, as previously discussed.

Solenoid 77 comprises trip rod 75 for engaging or pivoting the pole handle 34 in response to the trip signal, and provides the means to trip the circuit breaker 100 under arc fault conditions. That is when an arc fault is sensed, circuit board 76 generates a trip signal to actuate solenoid 77, which extends the trip rod 75 to engage pole handle 34. Because pole handles 34 and 122 are tied together via handle tie 162, both the pole handles 34 and 122 pivot, which in turn pivots blades 42 and 154 respectively. Therefore contacts 38 and 40 in the mechanical compartment 24, and contacts 150 and 154 in the second mechanical compartment 134 operate simultaneously to open the first and second load current paths respectively.

In the exemplary embodiments of the single pole 10 and two pole 100 circuit breakers, the mechanical compartment 24, and housings 12 and 14 are common to both. It will be appreciated by one skilled in the art that this feature enables the mechanical compartment 24 to be assembled as a separate subassembly. This allows for subassembly calibration and testing of the mechanical compartment 24. Additionally, it provides for greater economies of scale, as well as a significant reduction in tooling.

While preferred embodiments have been shown and described, various modifications and substitutions may be made thereto without departing from the spirit and scope of the invention. Accordingly, it is understood that the present invention has been described by way of illustrations and not limitation.

What is claimed is:

1. A circuit breaker comprising:

a first housing having a first compartment;

a second housing having a second compartment, and having a first opening, said second housing assembled to said first housing to enclose said first compartment;

a first plurality of electrically connected components disposed within said first compartment, including a first interconnecting component extending into said second compartment through said first opening;

a second plurality of electrically connected components disposed within said second compartment, said first interconnecting component providing electrical interconnection to said second plurality of components within said second compartment;

a third housing having a third compartment, and having a second opening, said third housing assembled to said second housing to enclose said second compartment;

said second plurality of components including a second interconnecting component extending into said third compartment through said second opening;

a third plurality of electrically connected components disposed within said third compartment, said second interconnecting component providing electrical interconnection to said third plurality of components within said third compartment;

a fourth housing including a fourth compartment, and having a third opening, said fourth housing assembled to said third housing to enclose said third compartment;

said third plurality of components having a third interconnecting component extending into said fourth compartment through said third opening; and a fourth plurality of electrically connected components disposed within said fourth compartment, said third interconnecting component providing electrical interconnection to said fourth plurality of components within said fourth compartment.

2. The circuit breaker of claim 1 wherein said circuit breaker is an arc fault circuit breaker.

3. The circuit breaker of claim 7 wherein said first plurality of components further comprises a bi-metal resistor.

4. The circuit breaker of claim 7 wherein said second plurality of components further comprises a current sensing transformer.

5. The circuit breaker of claim 2 wherein said third interconnecting component comprises a second load current carrying component.

6. The circuit breaker of claim 2 wherein said fourth plurality of components further comprises a bi-metal resistor.

7. The circuit breaker of claim 1 wherein said first housing, said second housing, and said first plurality of components further comprise a separate subassembly.

8. The circuit breaker of claim 1 wherein said second interconnecting component comprises a single load current carrying component.

9. The circuit breaker of claim 8 wherein said second plurality of components further comprises a load lug.

10. The circuit breaker of claim 8 wherein said third plurality of components further comprises a load lug.

11. The circuit breaker of claim 1 wherein said electrical interconnection to said second plurality of components comprises a weld, bolt or crimp.

12. The circuit breaker of claim 1 wherein said electrical interconnection to said third plurality of components comprises a weld, bolt or crimp.

13. The circuit breaker of claim 1 wherein said circuit breaker is a two pole arc fault circuit breaker.

14. A method of assembling a circuit breaker, comprising:

connecting electrically a first plurality of components disposed within a first compartment of a first housing, said first plurality of components including a first interconnecting component;

assembling a second housing to said first housing to enclose said first compartment, said second housing defining a second compartment;

extending said first interconnecting component through a first opening of said second housing into said second compartment;

connecting electrically a second plurality of components disposed within said second compartment;

interconnecting electrically said first interconnecting component to said second plurality of components disposed within said second compartment;

assembling a third housing to said second housing to enclose said second compartment, said third housing defining a third compartment;

extending a second interconnecting component of said second plurality of components through a second opening of said third housing into said third compartment;

connecting electrically a third plurality of components disposed within said third compartment;

interconnecting electrically said second interconnecting component to said third plurality of components disposed within said third compartment;

assembling a fourth housing to said third housing to enclose said third compartment, said fourth housing defining a fourth compartment;

extending a third interconnecting component of said third plurality of components through a third opening of said fourth housing into said fourth compartment;

connecting electrically a fourth plurality of components disposed within said fourth compartment; and interconnecting electrically said third interconnecting component to said fourth plurality of components disposed within said fourth compartment.

15. The method of claim 14 wherein said circuit breaker is an arc fault circuit breaker.

16. The method of claim 15 wherein said first plurality of components further comprises a bi-metal resistor.

17. The method of claim 15 wherein said second plurality of components further comprises a current sensing transformer.

18. The method of claim 15 wherein extending said third interconnecting component further comprises extending a second single load current carrying interconnecting component.

19. The method of claim 15 wherein said fourth plurality of components further comprises a bi-metal resistor.

20. The method of claim 14 wherein assembling said second housing further comprises enclosing said first compartment to form a separate subassembly.

21. The method of claim 14 wherein extending said second interconnecting component further comprises extending a single load current carrying interconnecting component.

22. The method of claim 21 wherein said second plurality of components further comprises a load lug.

23. The method of claim 21 wherein said third plurality of components further comprises a load lug.

24. The method of claim 14 wherein electrically interconnecting said first interconnecting component further comprises welding, bolting or crimping said first interconnecting component.

25. The method of claim 14 wherein electrically interconnecting said second interconnecting component further comprises welding, bolting or crimping said second interconnecting component.

* * * * *